(12) United States Patent
Tanaka et al.

(10) Patent No.: US 8,211,845 B2
(45) Date of Patent: Jul. 3, 2012

(54) CLEANING COMPOSITION FOR REMOVING LEAD-FREE SOLDER FLUX AND SYSTEM FOR REMOVING LEAD-FREE SOLDER FLUX

(75) Inventors: Keita Tanaka, Osaka (JP); Takashi Tanaka, Osaka (JP)

(73) Assignee: Arakawa Chemical Industries, Ltd., Osaka-shi (JP)

( * ) Notice: Subject to any disclaimer, the term of this patent is extended or adjusted under 35 U.S.C. 154(b) by 19 days.

(21) Appl. No.: 12/999,471

(22) PCT Filed: Aug. 17, 2009

(86) PCT No.: PCT/JP2009/064377
§ 371 (c)(1),
(2), (4) Date: Dec. 16, 2010

(87) PCT Pub. No.: WO2010/024141
PCT Pub. Date: Mar. 4, 2010

(65) Prior Publication Data
US 2011/0094545 A1    Apr. 28, 2011

(30) Foreign Application Priority Data

Aug. 27, 2008  (JP) ................................. 2008-217589

(51) Int. Cl.
*C11D 7/16*   (2006.01)
*C11D 7/26*   (2006.01)
*C11D 7/32*   (2006.01)
*C11D 7/50*   (2006.01)
*B08B 3/04*   (2006.01)

(52) U.S. Cl. ........ 510/175; 510/421; 510/423; 510/499; 510/505

(58) Field of Classification Search .................. 510/175, 510/421, 423, 499, 505
See application file for complete search history.

(56) References Cited

U.S. PATENT DOCUMENTS

| | | | |
|---|---|---|---|
| 5,256,209 A | 10/1993 | Chihara | |
| 2009/0042762 A1* | 2/2009 | Zenfuku | 510/175 |

FOREIGN PATENT DOCUMENTS

| | | |
|---|---|---|
| JP | 4-57899 | 2/1992 |
| JP | 5-271693 | 10/1993 |
| JP | 6-49497 | 2/1994 |
| JP | 8-73893 | 3/1996 |
| JP | 10-168488 | 6/1998 |
| WO | WO 2007/119392 A1 | 10/2007 |
| WO | WO 2009/020199 A1 | 2/2009 |

OTHER PUBLICATIONS

International Search Report for International Application No. PCT/JP2009/064377 dated Oct. 13, 2009.

* cited by examiner

*Primary Examiner* — Brian P Mruk
(74) *Attorney, Agent, or Firm* — Kratz, Quintos & Hanson, LLP

(57) ABSTRACT

An object of this invention is to provide a cleaner composition that has a desirable cleaning property and is easily separable from pre-rinsing water even when cleaning an object produced by using a lead-free soldering flux; and a lead-free soldering flux removal system using a pre-rinsing method that can reduce the amount of waste fluid.

The invention uses a cleaner composition for lead-free soldering flux, comprising (A) specific glycol ethers; (B) a specific polyoxyalkylene amine; and (C) a chelating agent that is at least one member selected from the group consisting of (c1) aliphatic hydroxycarboxylic acid chelating agents and (c2) (poly)phosphoric acid chelating agents.

8 Claims, No Drawings

CLEANING COMPOSITION FOR REMOVING LEAD-FREE SOLDER FLUX AND SYSTEM FOR REMOVING LEAD-FREE SOLDER FLUX

TECHNICAL FIELD

The present invention relates to a cleaner composition for removing lead-free soldering flux, and a system for removing lead-free soldering flux.

BACKGROUND ART

Soldering is a general technique for mounting electronic components on the surface of a printed circuit board. However, soldering produces corrosive flux residues that decrease the quality of the printed circuit substrate. For this reason, soldering must be followed by a process for cleaning the substrate, so as to remove the residues.

Cleaning of various electric components or alloy components have heretofore been performed using chlorinated cleaners containing chlorinated solvents, such as trichloroethylene, perchloroethylene, methylene chloride or the like as the main components. Such chlorinated solvents are advantageous in that they are nonflammable and have excellent drying properties. However, the use of chlorinated solvents is currently restricted because they cause ozone layer depletion, soil pollution and like environmental problems; and they are toxic to humans; etc. Further, in recent years, ensuring the cleaning effect against ionic residues such as chlorine ion, sulphate ion etc. has been particularly required in the cleaning of electric components etc.; however, chlorinated solvents have little ability to clean ionic residues.

Furthermore, in recent years, people have become aware of the hazards of lead, and the use of solders containing lead has been restricted in many countries. Accordingly, lead-free solder has been increasingly used. When a lead-free solder is used, the soldering temperature has to be set at least 30° C. higher than the case where a known tin-lead eutectic solder is used, except for some cases where specific alloy-based lead-free solders are used; additionally, the solder wettability of lead-free solder is inferior to that of known eutectic solder. In order to solve such problems, a stronger activator than that normally used in lead-free soldering flux is used. Accordingly, the flux used for lead-free solder is more likely to produce reaction products during the soldering process than the known tin-lead eutectic solder.

The reaction product is a tin salt compound, such as a salt of activator, contained in the flux used for lead-free solders, and tin or a salt of resin acid and tin. These tin salt compounds are bivalent or tetravalent tin salts, which have significantly poor solubility to cleaners. Therefore, when cleaning of lead-free solder is conducted using a known halogen-free cleaner composition or a polar or non-polar organic solvent, due to its insufficient ability to remove tin salt compounds, flux residues derived from the tin salt remain on the surface of the cleaned object, or pollutants derived from the tin salt will re-attach to the surface of the cleaned object.

When the object to be cleaned is a sheet-type article, such as a mounted board, it is common to use a spray to apply the cleaner and the rinsing liquid (water, in general) to the object so as to improve efficiency during the cleaning process and water-rinsing process. For example, some Patent Literatures disclosed a method using a cleaner containing a surfactant that is used in the form of a spray (Patent Literatures 1 and 2). However, when water is sprayed to the object after the object is cleaned using the cleaner of Patent Literature 1 or 2, a large amount of foam is generated on the surface of the object. This causes some complications in the management of the water-rinsing process. An antifoaming agent may solve this problem; however, the use of an antifoaming agent may result in improper washing.

In addition, there has been a demand for a cleaning system that can reduce the amount of waste fluid in terms of reduction of environmental burden. However, in the reservoir rinsing method used for the rinsing process in the semi-aqueous flux cleaning system, washing solution and flux resulted from the cleaning step are accumulated in the pre-rinsing water in the pre-rinsing tank, and when the concentration reaches a certain level that may influence the surface quality of the object to be cleaned and the water quality of the post-rinsing water, all of the rinsing water is discarded. The amount of pre-rinsing waste fluid thus generated is actually larger than the consumption amount and disposal amount of the cleaner used in the general cleaning and water-rinsing step using a spray. Hence, this large amount of waste fluid has posed a great environmental burden. Further, since all of the pre-rinsing water is also discarded as pre-rinsing waste fluid, it is necessary to replace all of the pre-rinsing water with fresh water. Therefore, if the cleaning process is performed with a cleaner composition that can be easily separated from the pre-rinsing water, it becomes possible to completely remove only the cleaner composition. This allows reuse of pre-rinsing water, thereby reducing the frequency of replacement of pre-rinsing water with fresh water. This should be conducive to reduction of environmental burden.

PRIOR ART DOCUMENT

Patent Literature

PTL 1: Japanese Unexamined Patent Publication No. 1992-57899

PTL 2: Japanese Unexamined Patent Publication No. 1996-73893

SUMMARY OF INVENTION

Technical Problem

An object of the present invention is to provide a cleaner composition that has a desirable cleaning property and is easily separable from pre-rinsing water even when cleaning an object produced by using a lead-free soldering flux; and a lead-free soldering flux removal system using a pre-rinsing method that can reduce the amount of waste fluid.

Solution to Problem

The present inventors conducted extensive research to achieve the above object, and found that the above object can be solved by performing the cleaning using a specific cleaner composition. The present invention has been accomplished based on these findings.

Specifically, the present invention relates to the following cleaner compositions for lead-free soldering flux, and a lead-free soldering flux removal system.

1. A cleaner composition for lead-free soldering flux, comprising:
   (A) glycol ethers, comprising:
   (a1) 30 to 49 wt % of a glycol ether having a solubility of less than 2% in water at 20° C. and a specific gravity of 0.98 or less, (a2) 3 to 30 wt % of a glycol ether having a solubility of 2 to 10% in water at 20° C. and a specific gravity of 0.98 or less, and (a3) 21 to 60 wt % of a glycol ether soluble in water at 20° C. and having a specific gravity of 0.98 or less;

(B) a polyoxyalkylene amine represented by General Formula (1):

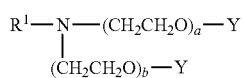
[Chem. 1]

wherein $R^1$ represents $C_{1-7}$ alkyl, Y represents $C_{1-7}$ alkyl or hydrogen, "a" represents an integer of 1 to 15, and "b" represents an integer of 0 to 15; and (C) a chelating agent that is at least one member selected from the group consisting of (c1) aliphatic hydroxycarboxylic acid chelating agents and (c2) (poly)phosphoric acid chelating agents.

2. The cleaner composition for lead-free soldering flux according to Item 1, wherein:
Component (a1) is a glycol ether represented by General Formula (2),

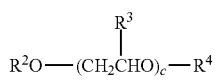
[Chem. 2]

wherein $R^2$ represents $C_{1-10}$ alkyl, $R^3$ represents methyl or hydrogen, $R^4$ represents $C_{1-10}$ alkyl or hydrogen, and "c" represents an integer of 1 to 4, Component (a2) is a glycol ether represented by General Formula (3),

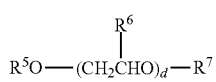
[Chem. 3]

wherein $R^5$ represents $C_{1-5}$ alkyl, $R^6$ represents methyl or hydrogen, $R^7$ represents $C_{1-5}$ alkyl or hydrogen, and "d" represents an integer of 1 to 4, and Component (a3) is a glycol ether represented by General Formula (4),

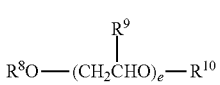
[Chem. 4]

wherein $R^5$ represents $C_{1-5}$ alkyl, $R^9$ represents methyl or hydrogen, $R^{15}$ represents $C_{1-5}$ alkyl or hydrogen, and "e" represents an integer of 1 to 4.

3. The cleaner composition for lead-free soldering flux according to Item 1 or 2, wherein:
the polyoxyalkylene amine (B) is an N-alkyl dialkanolamine.

4. The cleaner composition for lead-free soldering flux according to Item 3, wherein:
the N-alkyl dialkanolamine is at least one member selected from the group consisting of N-methyl diethanolamine, N-ethyl diethanolamine, N-propyl diethanolamine, N-butyl diethanolamine, and N-t-butyl diethanolamine.

5. The cleaner composition for lead-free soldering flux according to any one of Items 1 to 4, wherein:
the aliphatic hydroxycarboxylic acid chelating agent (c1) is at least one member selected from the group consisting of citric acid, isocitric acid, and malic acid.

6. The cleaner composition for lead-free soldering flux according to any one of Items 1 to 4, wherein:
the (poly)phosphoric acid chelating agent (c2) is at
least one member selected from the group consisting of orthophosphoric acid, pyrophosphoric acid and triphosphoric acid.

7. The cleaner composition for lead-free soldering flux according to any one of Items 1 to 6, comprising:
30 to 49 parts by weight of Component (a1);
3 to 20 parts by weight of Component (a2);
31 to 60 parts by weight of Component (a3);
0.01 to 30 parts by weight of Component (B);
0.01 to 10 parts by weight of Component (C); and
0 to 10 parts by weight of water.

8. A system for removing lead-free soldering flux, in which the cleaner composition for lead-free soldering flux according to any one of claims 1 to 7 is brought into contact with an object to which lead-free soldering flux is adhered; the object is brought into contact with a rinsing liquid; the resulting waste rinsing fluid is separated into an oil layer and a water layer; and the water layer is collected and reused.

Advantageous Effects of Invention

The cleaner composition of the present invention enables desirable removal of flux without leaving residues derived from tin salt compound, which are reaction products, during the cleaning of lead-free soldering flux.

Further, the cleaner composition of the present invention enables easy separation of waste fluid produced in the pre-rinsing step into an oil layer and a water layer, and allows reuse of the water layer, thereby reducing amount of waste fluid. This is advantageous both in terms of reducing environmental burden, and in terms of reducing cost for processing waste fluids.

Moreover, since the cleaner of the present invention does not contain a surfactant, the cleaner produces less foam in the spray-form water-rinsing process, thereby easing control of the water-rinsing process.

DESCRIPTION OF EMBODIMENTS

The cleaner of the present invention is used to clean off "lead-free soldering flux"; more specifically, a flux residue containing a tin derived from lead-free solder. Examples of "lead-free soldering flux" include (i) a flux residue generated after a soldering process using a paste formed of lead-free solder powder and a flux composition, and (ii) a flux residue generated after a process of soldering electrodes formed of lead-free solder via a flux composition.

Examples of the "lead-free solder" include Sn—Ag-based solder, Sn—Cu-based solder, Sn—Ag—Cu-based solder, Sn—Zn-based solder, and Sn—Sb-based solder.

Examples of the "flux composition" include compositions mainly containing base resins such as resin acids (natural rosin, polymerized rosin, α,β-unsaturated carboxylic acid modified rosin or the like) or synthetic resins (acrylic resin, polyamide resin or the like); an activator (organic acids such as adipic acid, halogen-based compounds such as silver diethylamine hydrobromide or the like); a thixotropic agent (hydrogenated castor oil, hydroxystearic acid ethylene bisamide or the like); and a solvent (diethyleneglycol monohexyl ether, diethyleneglycol monobutyl ether or the like) or the like.

The cleaner of the present invention comprises:

(A) glycol ethers (Component (A) hereinafter), containing:

(a1) 30 to 49 wt % of a glycol ether having a solubility of less than 2% in water at 20° C. and a specific gravity of 0.98 or less (Component (a1) hereinafter), (a2) 3 to 30 wt % (preferably 3 to 20 wt %) of a glycol ether having a solubility of 2 to 10% in water at 20° C. and a specific gravity of 0.98 or less (Component (a2) hereinafter), and (a3) 21 to 60 wt % (preferably 31 to 60 wt %) of a glycol ether soluble in water at 20° C., and having a specific gravity of 0.98 or less (Component (a3) hereinafter);

(B) a polyoxyalkylene amine (Component (B) hereinafter) represented by General Formula (1):

[Chem. 5]

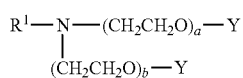

wherein $R^1$ represents $C_{1-7}$ alkyl, Y represents $C_{1-7}$ alkyl or hydrogen, "a" represents an integer of 1 to 15, and "b" represents an integer of 0 to 15; and (C) a chelating agent (Component (C), hereinafter) which is at least one member selected from the group consisting of (c1) aliphatic hydroxycarboxylic acid chelating agents (Component (c1) hereinafter) and (c2) (poly)phosphoric acid chelating agents (Component (c2) hereinafter).

There is no limitation to Component (a1), as long as it is a glycol ether having a solubility of about less than 2% (preferably not less than 0.5% and less than 2%) in water at 20° C., and a specific gravity of about 0.98 or less (preferably not more than 0.96). Various known glycol ethers may be used as Component (a1). The "solubility in water at 20° C." refers to a solute amount dissolvable in 100 g of water. Examples of Component (a1) include the following compound represented by General Formula (2):

[Chem. 6]

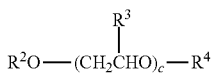

wherein $R^2$ represents $C_{1-10}$ alkyl, $R^3$ represents methyl or hydrogen, $R^4$ represents $C_{1-10}$ alkyl or hydrogen, and "c" represents an integer of 1 to 4.

More preferably, the compound represented by General Formula (2) is a compound represented by General Formula (2), wherein $R^2$ represents a $C_{4-8}$ alkyl, $R^3$ represents a methyl or hydrogen, $R^4$ represents a $C_4$ alkyl or hydrogen, and "c" represents an integer of 1 to 4.

Examples of the compounds represented by General Formula (2) include ethylene glycol monohexyl ether, ethylene glycol mono-2-ethylhexyl ether, diethylene glycol monohexyl ether, diethylene glycol mono-2-ethylhexyl ether, propylene glycol monohexyl ether, dipropylene glycol monohexyl ether, tripropylene glycol monohexyl ether, tetrapropylene glycol monohexyl ether, ethylene glycol dibutyl ether, diethylene glycol dibutyl ether, propylene glycol dibutyl ether, dipropylene glycol dibutyl ether, tripropylene glycol dibutyl ether, tetrapropylene glycol dibutyl ether and like glycol ethers. These glycol ethers can be used singly, or in a combination of two or more.

Further, there is no limitation to Component (a2), as long as it is a glycol ether having a solubility of about 2 to 10% in water at 20° C., and a specific gravity of about 0.98 or less (preferably about 0.95 or less). Various known glycol ethers may be used as Component (a2). Examples of Component (a2) include the following compound represented by General Formula (3):

[Chem. 7]

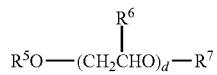

wherein $R^5$ represents $C_{1-5}$ alkyl, $R^6$ represents methyl or hydrogen, $R^7$ represents $C_{1-5}$ alkyl or hydrogen, and "d" represents an integer of 1 to 4.

More preferably, the compound represented by General Formula (3) is a compound represented by General Formula (3), wherein $R^5$ represents a $C_{3-4}$ alkyl, $R^6$ represents methyl, $R^7$ represents hydrogen, and "d" represents an integer of 1 to 2.

Examples of the compounds represented by General Formula (3) include propylene glycol monobutyl ether, dipropylene glycol monopropyl ether, dipropylene glycol monobutyl ether and like glycol ethers. These glycol ethers can be used singly, or in a combination of two or more.

Further, there is no limitation to Component (a3), as long as it is a water-soluble glycol ether having a specific gravity of about 0.98 or less. Various known glycol ethers may be used as Component (a3). Examples of Component (a3) include the following compound represented by General Formula (4):

[Chem. 8]

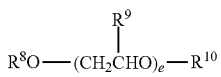

wherein $R^8$ represents $C_{1-5}$ alkyl, $R^9$ represents methyl or hydrogen, $R^{10}$ represents $C_{1-5}$ alkyl or hydrogen, and "e" represents an integer of 1 to 4.

More preferably, the compound represented by General Formula (4) is a compound represented by General Formula (4), wherein $R^8$ represents a $C_{1-4}$ alkyl, $R^9$ represents a methyl or hydrogen, $R^{10}$ represents a $C_{1-2}$ alkyl or hydrogen, and "e" represents an integer of 1 to 4.

Examples of the compounds represented by General Formula (4) include ethylene glycol monoethyl ether, ethylene glycol monobutyl ether, diethylene glycol monoethyl ether, diethylene glycol monobutyl ether, triethylene glycol monoethyl ether, triethylene glycol monobutyl ether, tetraethylene glycol monoethyl ether, tetraethylene glycol monobutyl ether, propylene glycol monoethyl ether, propylene glycol monopropyl ether, dipropylene glycol monomethyl ether, diethylene glycol dimethyl ether, diethylene glycol methyl ethyl ether, diethylene glycol diethyl ether, triethylene glycol dimethyl ether, tetraethylene glycol dimethyl ether and like glycol ethers. These glycol ethers can be used singly, or in a combination of two or more.

There is no limitation to Component (B), as long as it is the compound represented by the aforementioned General Formula (1). Various known glycol ethers may be used as Component (B).

Examples of Component (B) include N-alkyl dialkanolamines and N-alkyl monoalkanolamines. Examples of N-alkyl dialkanolamines include N-methyl diethanolamine, N-ethyl diethanolamine, N-propyl diethanolamine, N-butyl diethanolamine, and N-t-butyl diethanolamine. Examples of N-alkyl monoalkanolamines include N-methyl ethanolamine, N-ethyl ethanolamine, N-propyl ethanolamine, N-butyl ethanolamine, N-t-butyl ethanolamine, N,N-dimethyl ethanolamine, N,N-diethyl ethanolamine, and N,N-dibutyl ethanolamine. They can be used singly, or in a combination of two or more. Among them, N-alkyl dialkanolamines are preferable; particularly, at least one member selected from the group consisting of N-methyl diethanolamines, N-ethyl diethanolamines, N-propyl diethanolamines, N-butyl diethanolamines, and N-t-butyl diethanolamine is preferable, in terms of safety and the like, particularly in terms of the contamination-prevention property and low-foaming property.

Component (C) is not particularly limited, as long as it is a chelating agent that does not contain an amino group in the molecule, and is at least one member selected from the group consisting of Component (c1) and Component (c2). Various known chelating agents may be used as Component (C). The use of Component (c1) or Component (c2) improves the gap-cleaning property, and particularly improves the contamination-prevention property.

Component (c1) is a compound containing at least one or more carboxyl groups and at least one or more hydroxyl groups. A preferable example of Component (c1) is a hydroxy carboxylic acid, which is formed of a straight chain alkyl group having a carbon number of about 2 to 5 as its basic structure; and about 2 to 3 carboxyl groups and about 1 to 3 hydroxy groups bonded thereto. Examples of hydroxy carboxylic acids include citric acid, isocitric acid, malic acid, tartaric acid, and their salts (hereinafter, the salts denote sodium salts, potassium salts, ammonium salts, alkanol amine salts and the like). Among them, in terms of the gap-cleaning property, and particularly in terms of the contamination-prevention property, at least one member selected from the group consisting of citric acid, isocitric acid and malic acid is preferable, and citric acid is particularly preferable.

Component (c2) is preferably at least one member selected from the group consisting of orthophosphoric acid, pyrophosphoric acid and triphosphoric acid in terms of the gap-cleaning property, and particularly in terms of the contamination-prevention property. Pyrophosphoric acid is particularly preferable.

If a chelating agent having an amino group in the molecule is used instead of Component (C), it is likely to cause recontamination of the object to be cleaned during the water-rinsing process.

Water used for the cleaner composition of the present invention is not particularly limited. Examples of water include pure water, ion-exchange water, and purified water.

The cleaner of the present invention may contain various known additives insofar as the desired effects of the present invention are not impaired. Examples of the additives include antifoaming agents, antirusts, and antioxidants.

The amounts of the components used for the cleaner composition of the present invention are not particularly limited. However, in consideration of the desired effects of the present invention, generally, Component (a1) is 30 to 49 parts by weight, Component (a2) is 3 to 20 parts by weight, Component (a3) is 31 to 60 parts by weight, Component (B) is 0.01 to 30 parts by weight (preferably 0.1 to 10 parts by weight), Component (C) is 0.01 to 10 parts by weight (preferably 0.02 to 1 parts by weight), and water is about 0 to 10 parts by weight (preferably 1 to 8 parts by weight). The amount of the additive is generally about 5 parts by weight. The pH value of the cleaner composition is not particularly limited; however, it is generally about 2 to 10.

The lead-free soldering flux removal system of the present invention comprises bringing the cleaner composition for lead-free soldering flux of the present invention into contact with the object having lead-free soldering flux adhered thereon; bringing the object into contact with a rinsing liquid; separating the waste fluid produced in the rinsing process into an oil layer and a water layer; and collecting and reusing the obtained water layer.

The method of bringing the cleaner composition of the present invention into contact with the object having lead-free soldering flux adhered thereon is not particularly limited, and various known methods may be adopted. Examples of the methods include a method of spraying the cleaner onto an object to which the lead-free soldering flux is adhered by means of a spray device; a method of subjecting the object immersed in the cleaner composition to ultrasonic cleaning; and a method of using a direct cleaning device (e.g., a "Direct Pass™", product of Arakawa Chemical Industries, Ltd.; Japanese Patent No. 2621800).

The method of bringing the object into contact with a rinsing liquid is not particularly limited, and various known methods may be adopted. More specifically, for example, a method similar to the method of bringing the above-mentioned cleaner composition into contact with the object having lead-free soldering flux adhered thereon may be adopted.

The method of separating the waste rinsing fluid into an oil layer and a water layer may be performed by any known method. More specifically, for example, a method of keeping the waste rinsing fluid in a tank capable of statically storing the waste rinsing fluid while maintaining the liquid temperature for a certain period of time, and then discharging the generated oil layer; or a method of connecting the rinsing tank to a so-called oil/water separator, that is a device containing a special filter for accelerating coarsening and aggregation of the dispersed fine oil layer components; continuously circulating the waste rinsing fluid from the rinsing tank to the oil/water separator so that an oil layer is produced in the oil/water separator; and discharging the oil layer as produced. The waste rinsing fluid containing the cleaner composition for lead-free soldering flux of the present invention can be easily separated into an oil layer and a water layer by being kept at 40 to 80° C., and performing one of the above separation methods. Most of the cleaner composition comes up to the surface due to the difference in specific gravity, forming an oil layer. Further, since contamination components such as flux residues are dissolved in the oil layer, it is possible to reuse the separated water layer in the rinsing step.

EXAMPLES

The present invention is more specifically explained with reference to Examples and Comparative Examples. However, the present invention is not limited to these examples.

Preparation of Cleaner

The components shown in Table 1 (based on weight %) are mixed to prepare cleaners for the respective Examples and Comparative Examples.

TABLE 1

| | A | | | | | | | | | B | | C | | | other | |
|---|---|---|---|---|---|---|---|---|---|---|---|---|---|---|---|---|
| | a1 | | | a2 | | | a3 | | | | | c1 | | | c2 | |
| | HeDG | HeG | DBDG | PFDG | BFDG | BFG | BDG | MFDG | PFG | MBD | MEM | CA | MA | PA | water | EDTA |
| Ex. 1 | 40 | | | 15 | | | 36.9 | | | 3 | | 0.1 | | | 5 | |
| Ex. 2 | 40 | | | 15 | | | | 36.9 | | 3 | | 0.1 | | | 5 | |
| Ex. 3 | 40 | | | 15 | | | | | 36.9 | 3 | | 0.1 | | | 5 | |
| Ex. 4 | 40 | | | | 15 | | 36.9 | | | 3 | | 0.1 | | | 5 | |
| Ex. 5 | 40 | | | | 15 | | | 36.9 | | 3 | | 0.1 | | | 5 | |
| Ex. 6 | 40 | | | | 15 | | | | 36.9 | 3 | | 0.1 | | | 5 | |
| Ex. 7 | 40 | | | | | 15 | 36.9 | | | 3 | | 0.1 | | | 5 | |
| Ex. 8 | 40 | | | | | 15 | | 36.9 | | 3 | | 0.1 | | | 5 | |
| Ex. 9 | 40 | | | | | 15 | | | 36.9 | 3 | | 0.1 | | | 5 | |
| Ex. 10 | | 40 | | 15 | | | 36.9 | | | 3 | | 0.1 | | | 5 | |
| Ex. 11 | | 40 | | 15 | | | | 36.9 | | 3 | | 0.1 | | | 5 | |
| Ex. 12 | | 40 | | 15 | | | | | 36.9 | 3 | | 0.1 | | | 5 | |
| Ex. 13 | | 40 | | | 15 | | 36.9 | | | 3 | | 0.1 | | | 5 | |
| Ex. 14 | | 40 | | | 15 | | | 36.9 | | 3 | | 0.1 | | | 5 | |
| Ex. 15 | | 40 | | | 15 | | | | 36.9 | 3 | | 0.1 | | | 5 | |
| Ex. 16 | | 40 | | | | 15 | 36.9 | | | 3 | | 0.1 | | | 5 | |
| Ex. 17 | | 40 | | | | 15 | | 36.9 | | 3 | | 0.1 | | | 5 | |
| Ex. 18 | | 40 | | | | 15 | | | 36.9 | 3 | | 0.1 | | | 5 | |
| Ex. 19 | | | 30 | 20 | | | 41.9 | | | 3 | | 0.1 | | | 5 | |
| Ex. 20 | | | 30 | 20 | | | | 41.9 | | 3 | | 0.1 | | | 5 | |
| Ex. 21 | | | 30 | 20 | | | | | 41.9 | 3 | | 0.1 | | | 5 | |
| Ex. 22 | | | 30 | | 20 | | 41.9 | | | 3 | | 0.1 | | | 5 | |
| Ex. 23 | | | 30 | | 20 | | | 41.9 | | 3 | | 0.1 | | | 5 | |
| Ex. 24 | | | 30 | | 20 | | | | 41.9 | 3 | | 0.1 | | | 5 | |
| Ex. 25 | | | 30 | | | 20 | 41.9 | | | 3 | | 0.1 | | | 5 | |
| Ex. 26 | | | 30 | | | 20 | | 41.9 | | 3 | | 0.1 | | | 5 | |
| Ex. 27 | | | 30 | | | 20 | | | 41.9 | 3 | | 0.1 | | | 5 | |
| Ex. 28 | 40 | | | 15 | | | 36.9 | | | 3 | | | 0.1 | | 5 | |
| Ex. 29 | 40 | | | 15 | | | 36.9 | | | 3 | | | | 0.1 | 5 | |
| Ex. 30 | 40 | | | 15 | | | 39.4 | | | 0.5 | | 0.1 | | | 5 | |
| Ex. 31 | 40 | | | 15 | | | 32.9 | | | 7 | | 0.1 | | | 5 | |
| Ex. 32 | 40 | | | 15 | | | 39.4 | | | | 0.5 | 0.1 | | | 5 | |
| Ex. 33 | 40 | | | 15 | | | 36.9 | | | | 3 | 0.1 | | | 5 | |
| Ex. 34 | 40 | | | 15 | | | 32.9 | | | | 7 | 0.1 | | | 5 | |
| Ex. 35 | 40 | | | 15 | | | 39 | | | | | 1 | | | 5 | |
| Ex. 36 | 40 | | | 15 | | | 34 | | | 3 | | 3 | | | 5 | |
| Ex. 37 | 45 | | | 15 | | | 31.9 | | | 3 | | 0.1 | | | 5 | |
| Ex. 38 | 41.9 | | | 5 | | | 45 | | | 3 | | 0.1 | | | 5 | |
| Ex. 39 | 35 | | | 20 | | | 36.9 | | | 3 | | 0.1 | | | 5 | |
| C. Ex. 1 | 76.9 | | | 15 | | | | | | 3 | | 0.1 | | | 5 | |
| C. Ex. 2 | 40 | | | 51.9 | | | | | | 3 | | 0.1 | | | 5 | |
| C. Ex. 3 | 55 | | | | | | 36.9 | | | 3 | | 0.1 | | | 5 | |
| C. Ex. 4 | | | | 55 | | | 36.9 | | | 3 | | 0.1 | | | 5 | |
| C. Ex. 5 | | | | 15 | | | 76.9 | | | 3 | | 0.1 | | | 5 | |
| C. Ex. 6 | 40 | | | 15 | | | 37 | | | 3 | | | | | 5 | |
| C. Ex. 7 | 40 | | | 15 | | | 39.9 | | | | | 0.1 | | | 5 | |
| C. Ex. 8 | 40 | | | 15 | | | 39.9 | | | 3 | | | | | 5 | 0.1 |

Ex. = Examples
C. Ex. = Comparative Examples

The table uses the following abbreviations.
HeDG: diethylene glycol monohexyl ether
HeG: ethylene glycol monohexyl ether
DBDG: diethylene glycol dibutyl ether
PFDG: dipropylene glycol monopropyl ether
BFDG: dipropylene glycol monobutyl ether
BFG: propylene glycol monobutyl ether
BDG: diethylene glycol monobutyl ether
MFDG: dipropylene glycol monomethyl ether
PFG: propylene glycol monopropyl ether
MBD: N-butyl diethanolamine
MEM: N-ethyl ethanolamine
CA: citric acid
MA: malic acid
PA: pyrophosphate
EDTA: ethylene diamine tetraacetic acid Comparative Example 8 could not be prepared because EDTA was not dissolved in the cleaner.

Preparation of Lead-Free Soldering Flux

A commercially available lead-free solder paste (product name: "TASLF-219Y", Arakawa Chemical Industries, Ltd.; composition of lead-free solder powder: Sn=96.5%, Ag=3.0%, Cu=0.5%) was placed in a glass vial. The glass vial was heated on a hot plate at 270° C. to dissolve the lead-free solder powder. The resultant fluid from the melt-blending separated into deposited solder alloys and a flux component. This flux component was used as a model of a flux residue derived from soldering using a lead-free solder. The following experiments used this flux component as lead-free soldering flux.

Test 1: Evaluation of Flux Solubility

The above flux residue model was added to each of the cleaners of Examples and Comparative Examples heated in advance to 60° C. in an amount of 1 wt %, 2 wt %, or 3 wt %. Each mixture was stirred for 20 minutes to prepare a test liquid. The appearance of each test liquid upon preparation was visually evaluated.

○: Test liquid was transparent.

×: Test liquid was a white, turbid color, or contained insoluble precipitates.

Test 2: Evaluation of Oil/water separation efficiency

An initial liquid (flux concentration=0%) and a flux-containing liquid (flux concentration=1.0%) were prepared for each of the cleaners (Examples and Comparative Examples). Each initial liquid and flux-containing liquid were added to ion-exchanged water so that the concentration thereof became 10 wt %. Each mixture was stirred to disperse the liquid and allowed to stand for 20 minutes at 60° C. to separate the dispersion into an oil layer and a water layer, and the water layer (lower layer) was collected. The refraction index of the obtained water layer (rinsing water model) at 20° C. was measured using an "Abbe Refractometer NAR-1T" (Atago Co., Ltd.), and the measured value was converted into a cleaner concentration (x) using an analytical curve. Then, a separation efficiency ((10−x)/10×100[%]) was calculated. A higher separation efficiency is preferred, because an increase in separation efficiency decreases the cleaner concentration of the water layer to be reused.
○: Separation efficiency=60% or more
Δ: Separation efficiency=more than 30% and less than 60%
×: Separation efficiency=not more than 30%

Test 3: Evaluation of Foaming Property

Ion-exchange water was added to each cleaner of the Examples and Comparative Examples so as to dilute the cleaner until the cleaner content became 3 wt %. 5 ml of the diluted liquid was poured in a glass test tube (ϕ15 mm×150 mm), and the test tube was sealed. After being heated to 60° C., the test tube was shaken hard ten times. The liquid was then allowed to stand for 10 seconds, and the height (mm) of the foam was measured.

A greater height of the foam denotes increased foam generation during the water-rinsing process (spray form). Table 2 shows the results.

TABLE 2

| | Evaluation data | | | | | |
|---|---|---|---|---|---|---|
| | Flux solubility | | | Water/oil separation efficiency | | Foaming property/mm |
| | 1% | 2% | 3% | Initial liquid | Flux-containing liquid | |
| Ex. 1 | ○ | ○ | ○ | ○ | ○ | 0 |
| Ex. 2 | ○ | ○ | ○ | ○ | ○ | 0 |
| Ex. 3 | ○ | ○ | ○ | ○ | ○ | 0 |
| Ex. 4 | ○ | ○ | ○ | ○ | ○ | 0 |
| Ex. 5 | ○ | ○ | ○ | ○ | ○ | 0 |
| Ex. 6 | ○ | ○ | ○ | ○ | ○ | 0 |
| Ex. 7 | ○ | ○ | ○ | ○ | ○ | 0 |
| Ex. 8 | ○ | ○ | ○ | ○ | ○ | 0 |
| Ex. 9 | ○ | ○ | ○ | ○ | ○ | 0 |
| Ex. 10 | ○ | ○ | ○ | ○ | ○ | 0 |
| Ex. 11 | ○ | ○ | ○ | ○ | ○ | 0 |
| Ex. 12 | ○ | ○ | ○ | ○ | ○ | 0 |
| Ex. 13 | ○ | ○ | ○ | ○ | ○ | 0 |
| Ex. 14 | ○ | ○ | ○ | ○ | ○ | 0 |
| Ex. 15 | ○ | ○ | ○ | ○ | ○ | 0 |
| Ex. 16 | ○ | ○ | ○ | ○ | ○ | 0 |
| Ex. 17 | ○ | ○ | ○ | ○ | ○ | 0 |
| Ex. 18 | ○ | ○ | ○ | ○ | ○ | 0 |
| Ex. 19 | ○ | ○ | ○ | ○ | ○ | 0 |
| Ex. 20 | ○ | ○ | ○ | ○ | ○ | 0 |
| Ex. 21 | ○ | ○ | ○ | ○ | ○ | 0 |
| Ex. 22 | ○ | ○ | ○ | ○ | ○ | 0 |
| Ex. 23 | ○ | ○ | ○ | ○ | ○ | 0 |
| Ex. 24 | ○ | ○ | ○ | ○ | ○ | 0 |
| Ex. 25 | ○ | ○ | ○ | ○ | ○ | 0 |
| Ex. 26 | ○ | ○ | ○ | ○ | ○ | 0 |
| Ex. 27 | ○ | ○ | ○ | ○ | ○ | 0 |
| Ex. 28 | ○ | ○ | ○ | ○ | ○ | 0 |
| Ex. 29 | ○ | ○ | ○ | ○ | ○ | 0 |
| Ex. 30 | ○ | ○ | ○ | ○ | ○ | 0 |
| Ex. 31 | ○ | ○ | ○ | ○ | ○ | 0 |
| Ex. 32 | ○ | ○ | ○ | ○ | ○ | 0 |
| Ex. 33 | ○ | ○ | ○ | ○ | ○ | 0 |
| Ex. 34 | ○ | ○ | ○ | ○ | ○ | 0 |
| Ex. 35 | ○ | ○ | ○ | ○ | ○ | 0 |
| Ex. 36 | ○ | ○ | ○ | ○ | ○ | 0 |
| Ex. 37 | ○ | ○ | ○ | ○ | ○ | 0 |
| Ex. 38 | ○ | ○ | ○ | ○ | ○ | 0 |
| Ex. 39 | ○ | ○ | ○ | ○ | ○ | 0 |
| C. Ex. 1 | × | × | × | ○ | × | 0 |
| C. Ex. 2 | × | × | × | ○ | × | 0 |
| C. Ex. 3 | ○ | × | × | ○ | ○ | 0 |
| C. Ex. 4 | × | × | × | × | × | 11 |
| C. Ex. 5 | ○ | ○ | ○ | × | × | 19 |
| C. Ex. 6 | ○ | ○ | ○ | ○ | × | 0 |
| C. Ex. 7 | × | × | × | ○ | × | 0 |
| C. Ex. 8 | — | — | — | — | ○ | — |

Ex. = Examples
C. Ex. = Comparative Examples

The invention claimed is:

1. A cleaner composition for lead-free soldering flux, comprising:
(A) glycol ethers, comprising:
(a1) 30 to 49 wt % of a glycol ether having a solubility of less than 2% in water at 20° C. and a specific gravity of 0.98 or less,
(a2) 3 to 30 wt % of a glycol ether having a solubility of 2 to 10% in water at 20° C. and a specific gravity of 0.98 or less, and
(a3) 21 to 60 wt % of a glycol ether soluble in water at 20° C. and having a specific gravity of 0.98 or less;
(B) a polyoxyalkylene amine represented by General Formula (1):

[Chem. 1]

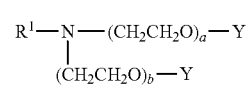

wherein $R^1$ represents $C_{1-7}$ alkyl, Y represents $C_{1-7}$ alkyl or hydrogen, "a" represents an integer of 1 to 15, and "b" represents an integer of 0 to 15; and
(C) a chelating agent that is at least one member selected from the group consisting of (c1) aliphatic hydroxycarboxylic acid chelating agents and (c2)(poly)phosphoric acid chelating agents.

2. The cleaner composition for lead-free soldering flux according to claim 1, wherein:
Component (a1) is a glycol ether represented by General Formula (2),

[Chem. 2]

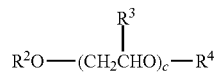

wherein $R^2$ represents $C_{1-10}$ alkyl, $R^3$ represents methyl or hydrogen, $R^4$ represents $C_{1-10}$ alkyl or hydrogen, and "c" represents an integer of 1 to 4, Component (a2) is a glycol ether represented by General Formula (3),

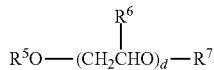

[Chem. 3]

wherein $R^5$ represents $C_{1-5}$ alkyl, $R^6$ represents methyl or hydrogen, $R^7$ represents $C_{1-5}$ alkyl or hydrogen, and "d" represents an integer of 1 to 4, and Component (a3) is a glycol ether represented by General Formula (4),

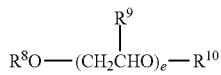

[Chem. 4]

wherein $R^8$ represents $C_{1-5}$ alkyl, $R^9$ represents methyl or hydrogen, $R^{10}$ represents $C_{1-5}$ alkyl or hydrogen, and "e" represents an integer of 1 to 4.

3. The cleaner composition for lead-free soldering flux according to claim 1 or 2, wherein:
the polyoxyalkylene amine (B) is an N-alkyl dialkanolamine.

4. The cleaner composition for lead-free soldering flux according to claim 3, wherein:
the N-alkyl dialkanolamine is at least one member selected from the group consisting of N-methyl diethanolamine, N-ethyl diethanolamine, N-propyl diethanolamine, N-butyl diethanolamine, and N-t-butyl diethanolamine.

5. The cleaner composition for lead-free soldering flux according to claim 1 or 2, wherein:
the aliphatic hydroxycarboxylic acid chelating agent (c1) is at least one member selected from the group consisting of citric acid, isocitric acid, and malic acid.

6. The cleaner composition for lead-free soldering flux according to claim 1 or 2, wherein:
the (poly)phosphoric acid chelating agent (c2) is at least one member selected from the group consisting of orthophosphoric acid, pyrophosphoric acid and triphosphoric acid.

7. The cleaner composition for lead-free soldering flux according to claim 1 or 2, comprising:
30 to 49 parts by weight of Component (a1);
3 to 20 parts by weight of Component (a2);
31 to 60 parts by weight of Component (a3);
0.01 to 30 parts by weight of Component (B);
0.01 to 10 parts by weight of Component (C); and
0 to 10 parts by weight of water.

8. A system for removing lead-free soldering flux, in which the cleaner composition for lead-free soldering flux according to claim 1 or 2 is brought into contact with an object to which lead-free soldering flux is adhered; the object is brought into contact with a rinsing liquid; the resulting waste rinsing fluid is separated into an oil layer and a water layer; and the water layer is collected and reused.

\* \* \* \* \*